United States Patent [19]

Umeki et al.

[11] Patent Number: 4,689,497
[45] Date of Patent: Aug. 25, 1987

[54] MASTER-SLAVE TYPE FLIP-FLOP CIRCUITS

[75] Inventors: Yoshitaka Umeki; Kazuyoshi Yamada, both of Tokyo, Japan

[73] Assignee: NEC Corporation, Tokyo, Japan

[21] Appl. No.: 740,766

[22] Filed: Jun. 3, 1985

[30] Foreign Application Priority Data

Jun. 8, 1984 [JP] Japan ................................ 59-117735

[51] Int. Cl.[4] ........................................... H03K 3/284
[52] U.S. Cl. .................................................. 307/272 A
[58] Field of Search ..................................... 307/272 A

[56] References Cited

U.S. PATENT DOCUMENTS

| 10,810 | 1/1985 | Ootsuka | 307/272 A |
| 190,711 | 10/1984 | Nakahara | 307/272 A |
| 3,812,384 | 5/1974 | Skorup | 307/272 A |
| 4,156,819 | 5/1979 | Takahashi et al. | 307/272 A |
| 4,289,979 | 9/1981 | Muller | 307/272 A |

Primary Examiner—Stanley D. Miller
Assistant Examiner—Trong Quang Phan
Attorney, Agent, or Firm—Burns, Doane, Swecker & Mathis

[57] ABSTRACT

In a master-slave type flip-flop circuit, a plurality of bipolar type transistors are used for master and slave flip-flop circuits, and transistors are connected such that glitch noise can be prevented under all input conditions.

4 Claims, 6 Drawing Figures

FIG. 3A CLK
FIG. 3B RST
FIG. 3C D
FIG. 3D S11
FIG. 3E QM
FIG. 3F Q
FIG. 3G TIME

PRIOR ART tA    tB

FIG. 6A CLK,S12
FIG. 6B RST
FIG. 6C D
FIG. 6D S11
FIG. 6E QM
FIG. 6F Q
FIG. 6G TIME tA    tB

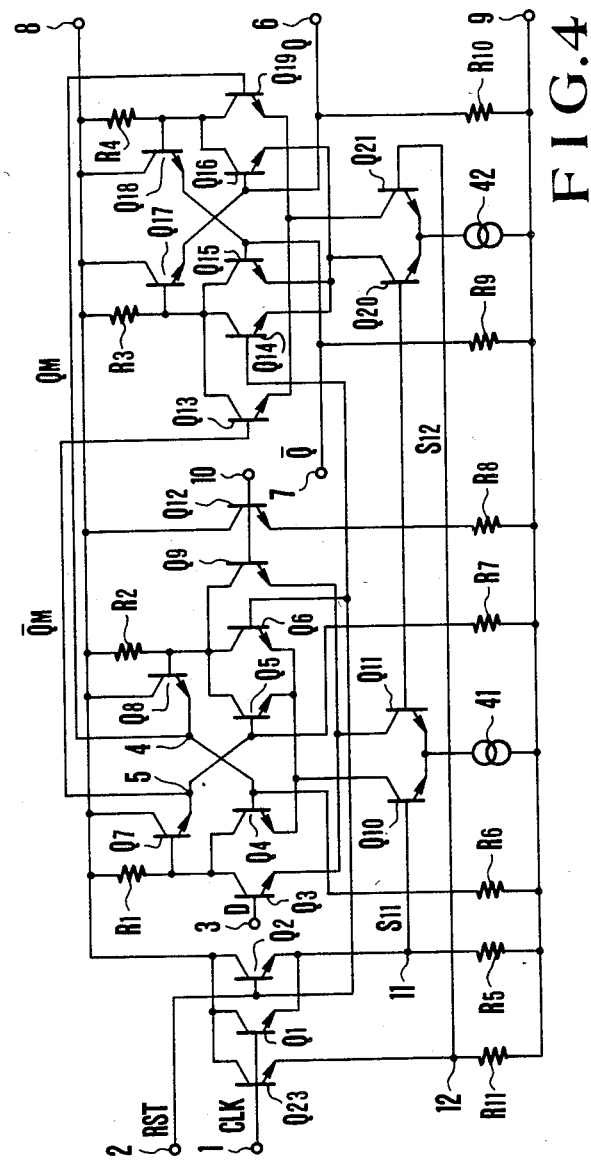
F I G. 4
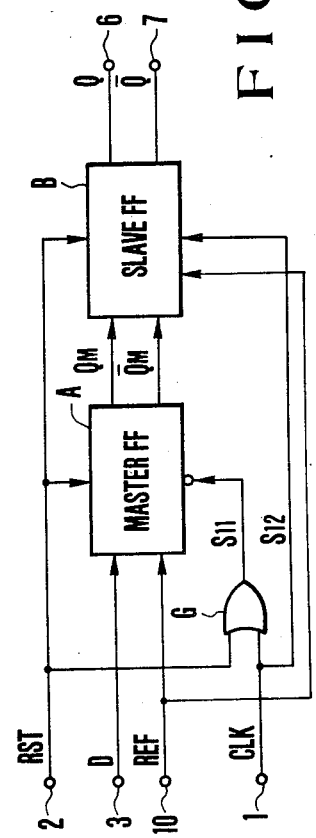
F I G. 5

MASTER-SLAVE TYPE FLIP-FLOP CIRCUITS

BACKGROUND OF THE INVENTION

This invention relates to a master-slave type flip-flop circuit, and more particularly, a master-slave type flip-flop circuit, with set and reset terminals, which is constituted by an emitter coupled logic circuit (hereinafter termed ECL).

The master slave type flip-flop circuit generally comprises a master flip-flop circuit and a slave flip-flop circuit. The output terminal of the master flip-flop circuit is connected to the input terminal of the slave flip-flop circuit. A data input signal is supplied to the input terminal of the master flip-flop circuit, while a data output signal is obtained at the output terminal of the slave flip-flop circuit. The master and slave flip-flop circuits are operated by a common clock signal so that when one of the flip-flop circuits is brought to a state in which the input signal can be written, the other flip-flop circuit becomes a state in which the present state can be maintained.

In the master-slave type flip-flop circuit which is constituted by ECL, when the clock pulse is at the low ("L") or high ("H") level the master flip-flop circuit is rendered to a write state in which data is written, and the slave flip-flop circuit is rendered to become a holding state, whereas when the clock pulse is at the "H" (or "L") level the slave flip-flop circuit is rendered to a write state in which the output signal of the master flip-flop circuit is written.

In a master-slave type flip-flop circuit utilizing a set signal or a reset signal in addition to a clock signal, the set or reset signal is supplied to both the master and slave flip-flop circuits. When the set or reset input is enabled, irrespective of the state of the clock input, the slave flip-flop circuit would be forcibly turned to the write state.

As an example of the prior art circuit, FIG. 1 shows a circuit of a D type master-slave flip-flop circuit with a reset terminal and constituted by an ECL. FIG. 2 is a simplified block diagram of the circuit shown in FIG. 1 in which A designates a master flip-flop circuit, B a slave flip-flop circuit, and G an OR gate circuit.

In the circuit shown in FIGS. 1 and 2, a reference numeral 1 designates an input terminal of a clock signal CLK, 2 an input terminal of a reset signal RST, 3 an input terminal of a data signal D, 8 a high potential side source input terminal, 9 a low potential side source input terminal and 10 a reference voltage input terminal.

The master flip-flop circuit is constituted by transistors $Q_3$ through $Q_{11}$, resistors $R_1$, $R_2$, $R_6$ and $R_7$ and a transformer 41, while the slave flip-flop circuit is constituted by transistors $Q_{13}$–$Q_{21}$, resistors $R_3$, $R_4$, $R_9$ and $R_{10}$ and transformer 42.

The master and slave flip-flop circuits have the same fundamental construction. In the following table, transistors of master and slave flip-flop circuits are shown with common transistor numbers.

TABLE

|        | Master F/F | Slave F/F |
|--------|------------|-----------|
| $Tr_1$ | $Q_7$      | $Q_{18}$  |
| $Tr_2$ | $Q_8$      | $Q_{17}$  |
| $Tr_3$ | $Q_3$      | $Q_{19}$  |
| $Tr_4$ | $Q_4$      | $Q_{16}$  |
| $Tr_5$ | $Q_9$      | $Q_{13}$  |
| $Tr_6$ | $Q_5$      | $Q_{15}$  |

TABLE-continued

|        | Master F/F | Slave F/F |
|--------|------------|-----------|
| $Tr_7$ | $Q_{11}$   | $Q_{21}$  |
| $Tr_8$ | $Q_{10}$   | $Q_{20}$  |
| $Tr_9$ | $Q_6$      | $Q_{14}$  |

In FIG. 1, the connections among various transistors of the master and slave flip-flop circuits are as follows.

More particularly, transistors $Tr_1$ and $Tr_2$ are paired with their collector electrodes connected to the positive source terminal 8, and emitter electrodes connected to the negative source terminal 9 via resistors (in the master flip-flop circuit, resistors $R_7$ and $R_6$, and in the slave flip-flop circuit, resistors $R_9$ and $R_{10}$. The emitter electrodes of transistors $Tr_1$ and $Tr_2$ are connected to output terminals 4, 5, and 6, 7 of respective flip-flop circuits. The base electrodes of transistors $Tr_1$ and $Tr_2$ are connected to two current paths. Thus, the base electrode of transistors $Tr_1$ is connected to the positive source terminal 8 via resistor $R_1$ or $R_4$ and to the collector electrodes of transistors $Tr_3$ and $Tr_4$. The base electrode of transistor $Tr_2$ is connected to the source terminal 8 via resistors $R_2$ or $R_3$, and to the collector electrodes of transistors $Tr_5$ and $Tr_6$.

The emitter electrode of transistor $Tr_1$ is connected to the base electrode of transistor $Tr_6$, while the emitter electrode of transistor $Tr_2$ is connected to the base electrode of transistor $Tr_4$. The emitter electrodes of transistors $Tr_4$ and $Tr_6$ are commonly connected to the collector electrode of transistor $Tr_8$. The emitter electrodes of transistors $Tr_3$ and $Tr_5$ are commonly connected to the emitter electrodes of transistor $Tr_7$. The emitter electrodes of transistors $Tr_7$ and $Tr_8$ are connected to the source terminal 9 via transformer 41 or 42.

The base electrode of transistor $Tr_9$ with its collector electrode connected to the collector electrode of transistor $Tr_6$ is connected to the reset signal input terminal 2. The emitter electrode of transistor $Q_6$, that is the transistor $Tr_9$ of the master flip-flop circuit, is connected to the collector electrode of transistor $Q_{10}$ together with the emitter electrode of transistor $Q_5$, that is transistor $Tr_6$, while the emitter electrode of transistor $Q_{14}$, that is transistor $Tr_9$ of the slave flip-flop circuit, is connected to the collector electrode of transistor $Q_{21}$ together with the emitter electrode of transistor $Q_{13}$, that is transistor $Tr_5$.

In the master and slave flip-flop circuits having constructions as above described, the output terminals 4 and 5 of the master flip-flop circuits are respectively connected to the base electrodes of transistors $Q_{19}$ and $Q_{13}$ at the input terminals of the slave flip-flop circuit.

The base electrode of transistor $Q_3$ at one input terminal of the master flip-flop circuit is connected to the data signal input terminal 3, and a reference voltage input terminal 10 is connected to the base electrode of transistor $Q_9$ at the other input terminal.

The reference voltage input terminal 10 is also connected to the base electrode of transistor $Q_{12}$. The collector electrode of transistor $Q_{12}$ is connected to the positive source terminal 8, and the emitter electrode is connected to the base electrodes of transistors $Q_{11}$ and $Q_{20}$ and to the negative source terminal 9 via resistor $R_8$. Transistor $Q_{12}$ is turned ON by the reference voltage so that the junction 12 between the emitter electrode of transistor $Q_{12}$ and resistor $R_8$ is at the "H" level with the result that transistor $Q_{11}$ and $Q_{20}$ are turned ON. When the transistor $Tr_7$ is turned ON as a result of the connection described above, the master flip-flop circuit or the slave flip-flop circuit is in a writable state, whereas when transistor Tr$_7$ is OFF, these flip-flop circuits do not accept an input signal.

Transistors Q$_1$ and Q$_2$ are connected in parallel with their collector electrodes connected to the source terminal 8, and the emitter electrodes connected to the source terminal 9 via resistor R$_5$. The base electrode of transistor Q$_1$ is connected to the input terminal 1 receiving the clock signal CLK, and the base electrode of transistor Q$_2$ is connected to the input terminal 2 receiving a reset signal RST. With this connection, a signal S$_{11}$ corresponding to the logic sum of signals CLK and RST appears at a junction 11 between the emitter electrodes of transistors Q$_1$ and Q$_2$. Thus this circuit constitutes the OR gate circuit G shown in FIG. 2. The output terminal of the OR gate circuit G, that is the junction 11 is connected to the base electrodes of transistors Q$_{10}$ and Q$_{21}$ of the master and slave flip-flop circuits respectively.

The master-slave type flip-flop circuit connected as described above operates as follows:

Signals Q$_M$ and $\overline{Q}_M$ at output terminals of the master flip-flop circuit are complementary with each other. Signals Q and $\overline{Q}$ at the output terminals 6 and 7 of the slave flip-flop circuit are also complementary with each other.

FIG. 3A–3F are timing charts along the same time axis and show signals CLK, RST, D, S$_{11}$, Q$_M$ and Q at respective terminals 1, 2, 3, 11, 4 and 6. Before a time t$_A$, clock signal CLK, reset signal RST, data signal D, signal S$_{11}$ at the junction 11, and the signal Q$_M$ at the output terminal 4 of the master flip-flop circuit are all at the "L" level, while signal Q at the output terminal 6 is at the "H" or "L" level (shown by dotted lines). The signal REF applied to the base electrode of transistor Q$_{12}$ is at the "H" level so that transistors Q$_{11}$ and Q$_{20}$ with their base electrodes connected to junction 12 are turned ON. Since signals CLK and RST are both at the "L" level, the signal S$_{11}$ the junction 11 is at the "L" level, thus turning OFF transistors Q$_{10}$ and Q$_{21}$. Since the signal RST is at the "L" level, the base electrodes of transistors Q$_6$ and Q$_{14}$ are at the "L" level so that these transistors are turned OFF.

When the data input signal D reaches the "H" level at time t$_A$, transistor Q$_3$ is turned ON and then transistor Q$_9$ is turned OFF. Consequently, the base potential of transistor Q$_8$ becomes the "H" level so that transistor Q$_8$ is turned ON, whereby the level of the signal Q$_M$ at terminal 4 becomes "H" (the level of signal $\overline{Q}_M$ at terminal 5 becomes "L"). At this time since the transistor Q$_{21}$ of the slave flip-flop circuit is OFF, irrespective of the variation of signal Q$_M$, the conduction states of transistors Q$_{17}$ and Q$_{18}$ of the slave flip-flop circuit would not be changed. As a result, the levels of the output signals Q and $\overline{Q}$ are not changed ("H" or "L"). Thus, the slave flip-flop circuit is at the holding state.

Then when the reset signal RST reaches the "H" level at time t$_B$ the output signal S$_{11}$ of the OR gate circuit G builds up for turning ON transistors Q$_{10}$ and Q$_{21}$ so that the state of the master flip-flop circuit changes to the holding state, while at the same time, the state of the slave flip-flop circuit changes to the writing state. At this time, since signal RST becomes the "H" level to turn ON transistor Q$_6$, the level of signal Q$_M$ changes to "L". At this time, in a period before the output signal Q$_M$ reaches the "L" level, both signals RST and Q$_M$ become "H" level, whereby the transistors Q$_{14}$ and Q$_{19}$ of the slave flip-flop circuit become ON. As a consequence, the output signals Q and $\overline{Q}$ at the output terminals 6 and 7 momentarily change to a threshold level. Due to this variation of the output signals Q and $\overline{Q}$, as shown in FIG. 3F, when the previous state of the output signal Q is at the "H" level, the operation is normal. However, if the previous state of the data output signal Q were "L" level, a glitch noise as shown by n$_1$ in FIG. 3F would be generated. The same is true for the data output signal Q. Consequently, if signal Q or $\overline{Q}$ were used as a clock input signal or a set input signal or a reset input signal for the circuit of a next stage, there would be a danger of causing the next stage circuit to malfunction.

Although the foregoing description concerns to the operation of a D type flip-flop circuit with a reset terminal, the same phenomenon occurs in a D type flip-flop circuit with a set terminal, and other type master-slave type flip-flop circuits with set or reset terminals.

As above described, in the prior art master-slave type flip-flop circuit with a set or reset terminal, under a certain input condition, glitch noise is formed in the output, the glitch noise reaching a threshold value. For this reason, the prior art master-slave type flip-flop circuit is subjected to a large limitation at the time of practical use. Especially, there is a problem that the output can not be used as a clock input signal, or a set input signal and a reset input signal for the circuit of the next stage.

SUMMARY OF THE INVENTION

It is an object of this invention to provide an improved master-slave type flip-flop circuit not forming a glitch noise in the output under all input conditions.

According to this invention there is provided a master slave type flip-flop circuit comprising a clock input terminal supplied with a clock signal; a data input terminal supplied with a data signal; a data output terminal outputting stored data; an output control terminal supplied with an output control data that determines the level of an output signal; a master flip-flop circuit with an input terminal connected to the data input terminal; a slave flip-flop circuit with an input terminal connected with an output terminal of the master flip-flop circuit and an output terminal connected with the data output terminal; a logic circuit inputted with the clock signal and the output control signal; each of the master and slave flip-flop circuits including a first control terminal supplied with an operating state control signal which brings the master and slave flip-flop circuits to a writable state or a holding state; a second control terminal supplied with the output control signal; means for connecting the output terminal of the logic circuit to the first control terminal of the master flip-flop circuit; means for connecting the clock terminal to the first control terminal of the slave flip-flop circuit; and means for connecting the output control terminal to the second control terminals of the master and slave flip-flop circuits.

The master-slave type flip-flop constituted as described above can prevent glitch noise under all input conditions.

BRIEF DESCRIPTION OF THE DRAWINGS

In the accompanying drawings:

FIGS. 3A through 3G are timing charts showing the wave forms of the signals of important elements shown in FIG. 1;

FIG. 4 is connection diagram showing one embodiment of the master-slave type flip-flop circuit according to this invention;

FIG. 5 is a simplified block diagram of the circuit shown in FIG. 4, and

FIGS. 6A through 6G are timing charts showing the wave forms of the signals of important elements of the circuit shown in FIG. 4.

DESCRIPTION OF THE PREFERRED EMBODIMENT

Figure 1:
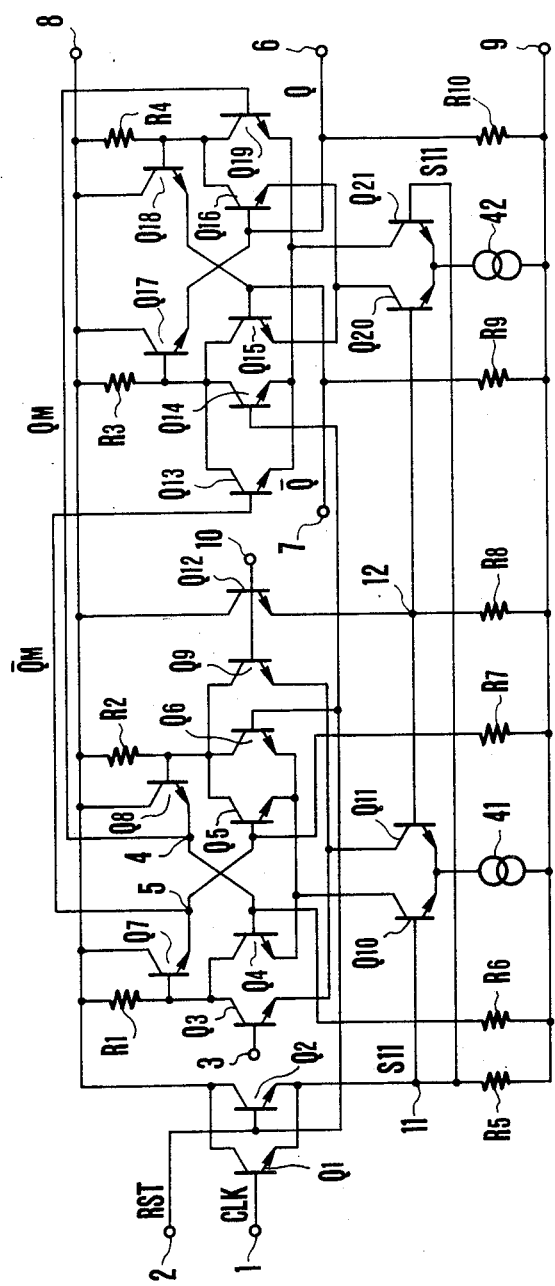
FIG. 1 is a connection diagram showing a prior art master-slave type flip-flop circuit.
Figure 2:
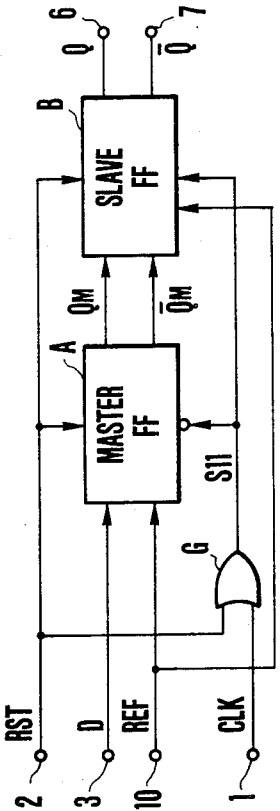
FIG. 2 is a simplified block diagram of the prior art circuit shown in FIG. 1.

In FIGS. 4 and 5 elements identical to those shown in FIGS. 1 and 2 are designated by the same reference characters. The master flip-flop circuit and the slave flip-flop circuit have the same construction as those shown in FIG. 1 except the followings: In the circuit shown in FIG. 4, to the input terminal 1 of clock signal CLK are connected the base electrodes of transistors $Q_1$ and $Q_2$ and the base electrode of transistor $Q_{23}$. The collector electrode of transistor $Q_{23}$ is connected to the positive source terminal 8 together with the collector electrodes of transistors $Q_1$ and $Q_2$, while the emitter electrode is connected to the negative source terminal 9 via resistor $R_{11}$ and to the base electrode of transistor $Q_{21}$.

The output terminal 11 of the OR gate circuit G made up of transistors $Q_1$ and $Q_2$ is connected to the base electrode of transistor $Q_{10}$. The emitter electrode of transistor $Q_{14}$ of the slave flip-flop circuit is connected to the emitter electrodes of transistors $Q_{15}$ and $Q_{16}$ and to the collector electrode of transistor $Q_{20}$.

The state transfer signal $S_{11}$ of the master flip-flop circuit is obtained at the output terminal 11 of the OR gate circuit G inputted with the clock signal CLK and the reset signal RST, while the state transfer signal $S_{12}$ of the slave flip-flop circuit is obtained from the emitter electrode of transistor $Q_{23}$. Consequently transistor $Q_{21}$ is turned ON or OFF when the signal CLK is at the "H" or "L" level, and transistor $Q_{10}$ is turned ON except a time at which the levels of signals RST and CLK are both "L".

The operation of the master flip-flop circuit shown in FIGS. 4 and 5 is as follows: FIGS. 6A–6F show examples of the wave forms of signals CLK, $S_{12}$, RST, D, $S_{11}$, $Q_M$ and Q at terminals 1, 12, 2, 3, 11, 4 and 6 of the master flip-flop circuit, along the same time axis shown in FIG. 6G. These wave forms show a case wherein the clock signal CLK is at the "L" level, that is the signal $S_{12}$ is at "L" level so that the slave flip-flop circuit is in the holding state.

Before time $t_A$, each of signals RST, D, $S_{11}$ and $Q_M$ is at the "L" level and the output signal Q is at the "H" or "L" level.

When the data signal D becomes the "H" level at time $t_A$, transistor $Q_3$ is turned ON with the result that a current path including source terminal 8, resistor $R_1$, transistors $Q_3$ and $Q_{11}$, transformer 41 and source terminal 9 would be established. As a consequence, the base voltage of transistor $Q_7$ decreases so that the level of the signal $\overline{Q}_M$ at the emitter electrode 5 changes to "L". At the same time transistor $Q_9$ is turned OFF so that the level of the voltage $Q_M$ at the emitter electrode 4 of transistor $Q_8$ becomes "H".

As above described, since transistor $Q_{21}$ of the slave flip-flop circuit is in the OFF state, the slave flip-flop circuit is in the holding state irrespective whether terminals 4 and 5 are at the "H" or "L" level. Accordingly, the output signals Q and $\overline{Q}$ maintain their previous values.

Then at time $t_B$ when the reset signal RST reaches the "H" level, signal $S_{11}$ builds up, thus turning ON transistor $Q_6$ and $Q_{10}$, whereby a current path including source terminal 8, resistor $R_2$, transistors $Q_6$ and $Q_{10}$, transformer 41 and source terminal 9 is establisned. Consequently the base voltage of transistor $Q_8$ decreases so that the level of the signal $Q_M$ at the emitter 4 changes to "L". Following this, the level of the voltage $\overline{Q}HD M$ becomes "H".

However, since the slave flip-flop is in the holding state, the outputs $Q_M$ and $\overline{Q}_M$ of the master flip-flop circuit would not be affected.

As the reset signal RST reaches the "H" level, transistor $Q_{14}$ of the slave flip-flop circuit is turned ON for establishing a current path including resistor $R_3$, transistors $Q_{14}$ and $Q_{20}$ and transformer 42.

Consequently, where output signals Q and $\overline{Q}$ are at "H" and "L" levels respectively, that is when transistor $Q_{16}$ is ON and transistor $Q_{15}$ is OFF, upon turning ON of transistor $Q_{14}$, the level of the signal Q at output terminal 6 becomes "L". Concurrently therewith, transistor $Q_{16}$ is turned OFF and hence the base voltage of transistor $Q_{18}$ increases so that the level of signal $\overline{Q}$ at the output terminal becomes "H".

Where the levels of signals Q and $\overline{Q}$ at output terminals 6 and 7 are at "L" and "H" respectively, in other words when transistor $Q_{16}$ OFF and when transistor $Q_{15}$ is ON, conduction of transistor $Q_{14}$ does not cause any influences so that output signals Q and $\overline{Q}$ maintain their voltage levels as they are.

For the reason described above, the glitch noise inevitable in the prior art circuit shown in FIG. 1, can be eliminated with the embodiment shown in FIG. 4.

Although in the foregoing, a case wherein the clock signal CLK is at the "L" level, and when the signal CLK is at the "H" level, transistor $Q_{21}$ becomes ON whereby the slave flip-flop circuit becomes the write state. Turning ON and OFF of transistors $Q_{17}$ and $Q_{18}$ are determined by the ON, OFF states of transistors $Q_{13}$ and $Q_{19}$, in other words by the output signals $Q_M$ and $\overline{Q}_M$ of the master flip-flop circuit applied to the base electrodes of transistors $Q_{13}$ and $Q_{19}$. Accordingly, in this case, there is no problem of glitch noise.

Although the embodiment described above concerns a D type flip-flop circuit with a reset terminal, according to this invention even in a D type master-slave type flip-flop circuit with a set terminal and in other type master-slave type flip-flop circuits, the same advantageous effect can be obtained.

What is claimed is:

1. A master-slave type flip-flop circuit comprising:
    a clock input terminal supplied with a clock signal;
    a data input terminal supplied with a data signal;
    a data output terminal outputting stored data;
    a reset control terminal supplied with a control signal that determines a level of said stored data;
    a master flip-flop circuit with an input terminal connected to said data input terminal;
    a slave flip-flop circuit with an input terminal connected with an output terminal of said master flip-flop circuit and an output terminal connected with said data output terminal;

logic circuit means inputted with said clock signal and said control signal for generating an internal control signal when at least one of said clock signal and said control signal is present;

each of said master and slave flip-flop circuits including first control terminal means for receiving an operating state control signal which brings said master and slave flip-flop circuits to a holding state and a writable state, respectively, and a second control terminal supplied with said output control signal;

means for applying said internal control signal from said logic circuit means to said first control terminal means of said master flip-flop circuit as said operating state control signal;

means for connecting said clock input terminal to said first control terminal means of said slave flip-flop circuit without passing through said logic circuit means thereby to apply said clock signal to said first control terminal means of said slave flip-flop as said operating state control signal thereto.

2. The master-slave type flip-flop circuit according to claim 1 wherein said master flip-flop circuit and said slave flip-flop circuit respectively comprise paired first and second transistors with collector electrodes connected to a positive source terminal, with emitter electrodes connected to a negative source terminal via resistors and with base electrodes connected to said positive source terminal via resistors; output terminals connected to emitter electrodes of said first and second transistors; third and fourth transistors with collector electrodes connected to the base electrode of said first transistors; fifth and sixth transistors with collector electrodes connected to said base electrode of said second transistor; means for connecting base electrodes of said fourth and sixth transistors to emitter electrodes of said second and first transistors, respectively; a seventh transistor with a collector electrode connected to emitter electrodes of said third and fifth transistors and with an emitter electrode connected to said negative source terminal; an eighth transistor with a collector electrode connected to emitter electrodes of said fourth and sixth transistor and with an emitter electrode connected to said negative source terminal; a ninth transistor connected in parallel with said sixth transistor; and wherein the emitter electrodes of the first and second transistors of said master flip-flop circuit are connected with base electrodes of the third and fifth transistors of said slave flip-flop circuit respectively, the base electrode of said third transistor of said master flip-flop circuit is used as said data input terminal, emitter electrodes of said first and second transistors of said slave flip-flop circuit are used as said data output terminal, the base electrode of the eighth transistor of said master flip-flop circuit is used as the first control terminal means of said master flip-flop circuit, the base electrode of said seventh transistor of said slave flip-flop circuit is used as the first control terminal means of said slave flip-flop circuit, and the base electrode of said ninth transistor is used as a second control terminal of both of said master and slave flip-flop circuits.

3. A master-slave flip-flop circuit comprising:
a clock input terminal supplied with a clock signal;
a data input terminal supplied with a data signal;
a data output terminal outputting stored data;
a reset terminal supplied with a reset signal that determines a level of an output signal;
a master flip-flop circuit with an input terminal connected to said data input terminal;
a slave flip-flop circuit with an input terminal connected with an output terminal of said master flip-flop circuit and an output terminal connected with said data output terminal;
each of said master and slave flip-flop circuits including data holding means, data writing means, a first control terminal for receiving a state control signal, a second control terminal for receiving said reset signal, and control means responsive to said state control signal for operatively enabling said holding means and writing means, said holding means of said master flip-flop circuit being enabled in response to application of said state control signal thereto, said writing means of said slave flip-flop circuit being enabled in response to application of said state control signal thereto;
an OR circuit receiving said clock signal and said reset signal;
first means for applying an output signal of said OR circuit to said first control terminal of said master flip-flop circuit as said state control signal thereto; and
second means for applying said clock signal directly to said first control terminal of said slave slip-flop circuit as said state control signal thereto without changing a phase of said clock signal and without passing through said OR circuit.

4. A master-slave type flip-flop circuit according to claim 3, wherein said OR circuit comprises two transistors which are connected in parallel with each other, having base electrodes connected with said reset terminal and said clock input terminal, respectively, having emitter electrodes commonly connected with said first means, and having collector electrodes commonly connected with a source terminal, and said second means comprises a transistor having a base electrode connected with said clock input terminal, an emitter electrode connected with said first control terminal of said slave flip-flop circuit, and a collector electrode connected with said source terminal.

* * * * *